(12) United States Patent
Uchida

(10) Patent No.: US 11,404,260 B2
(45) Date of Patent: Aug. 2, 2022

(54) INPUT LENS AND ELECTRON SPECTROMETER

(71) Applicant: JEOL Ltd., Tokyo (JP)

(72) Inventor: Tatsuya Uchida, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/032,092

(22) Filed: Sep. 25, 2020

(65) Prior Publication Data

US 2021/0098244 A1 Apr. 1, 2021

(30) Foreign Application Priority Data

Sep. 30, 2019 (JP) .............................. JP2019-178816

(51) Int. Cl.
| | | |
|---|---|---|
| *H01J 37/05* | (2006.01) | |
| *H01J 49/06* | (2006.01) | |
| *H01J 49/44* | (2006.01) | |
| *H01J 37/12* | (2006.01) | |
| *H01J 37/153* | (2006.01) | |

(52) U.S. Cl.
CPC ............ *H01J 49/068* (2013.01); *H01J 37/05* (2013.01); *H01J 37/12* (2013.01); *H01J 37/153* (2013.01); *H01J 49/44* (2013.01); *H01J 2237/05* (2013.01); *H01J 2237/153* (2013.01)

(58) Field of Classification Search
CPC .......... H01J 37/12; H01J 27/153; H01J 37/05; H01J 2237/05; H01J 2237/153; H01J 49/44; G01N 23/2273
See application file for complete search history.

(56) References Cited

U.S. PATENT DOCUMENTS

| | | | |
|---|---|---|---|
| 5,315,113 A | 5/1994 | Larson et al. | |
| 5,444,242 A | 8/1995 | Larson et al. | |
| 6,104,029 A * | 8/2000 | Coxon ................. | H01J 49/067 250/305 |
| 6,492,644 B1 * | 12/2002 | Staib ..................... | H01J 37/252 250/305 |
| 8,373,122 B2 * | 2/2013 | Kholine ................ | H01J 49/484 250/305 |

(Continued)

FOREIGN PATENT DOCUMENTS

| | | |
|---|---|---|
| JP | H7325052 A | 12/1995 |
| JP | 4802340 B2 | 8/2011 |

OTHER PUBLICATIONS

Extended European Search Report issued in EP20198606.4 dated Feb. 12, 2021.
Office Action issued in JP2019178816 dated Jul. 6, 2021.

*Primary Examiner* — Wyatt A Stoffa
(74) *Attorney, Agent, or Firm* — The Webb Law Firm

(57) ABSTRACT

An input lens is provided which has a large acceptance solid angle for electrons. The input lens is for use in an electron spectrometer and disposed between an electron source producing electrons and an electron analyzer in the electron spectrometer. The input lens has a reference electrode at a reference potential, a slit, first through nth electrodes, where n is an integer equal to or greater than three, arranged between the reference electrode and the slit, and a second mesh attached to the first electrode. The first through nth electrodes are arranged in this order along an optical axis. The second mesh is at a potential higher than the reference potential.

8 Claims, 5 Drawing Sheets

(56) References Cited

U.S. PATENT DOCUMENTS

| | | | |
|---|---|---|---|
| 2008/0135748 A1* | 6/2008 | Daimon | H01J 37/244 250/311 |
| 2010/0001202 A1* | 1/2010 | Matsuda | H01J 37/12 250/311 |
| 2016/0071690 A1* | 3/2016 | Shintake | H01J 37/244 250/305 |
| 2018/0211812 A1* | 7/2018 | Matsui | H01J 37/12 |
| 2020/0194141 A1* | 6/2020 | Van Veen | H01J 37/3007 |
| 2022/0146800 A1* | 5/2022 | Machida | G02B 15/20 |

\* cited by examiner

INPUT LENS AND ELECTRON SPECTROMETER

CROSS-REFERENCE TO RELATED APPLICATION

This application claims priority to Japanese Patent Application No. 2019-178816 filed Sep. 30, 2019, the disclosure of which is hereby incorporated by reference in its entirety.

BACKGROUND OF THE INVENTION

1. Field of the Invention

The present invention relates to an input lens and electron spectrometer.

2. Description of the Related Art

In electron spectrometers such as X-ray photoelectron spectrometers and Auger electron spectrometers, electron spectroscopy is performed. One known electron analyzer for allowing for such electron spectroscopy is a hemispherical analyzer. Where such an electron analyzer is employed, an input lens is disposed between an electron source and the electron analyzer. The input lens has various functions including decelerating electrons, focusing electrons, converting image magnification factors, and others.

For example, Japanese Patent No. 4,802,340 discloses an input lens comprising: a mesh disposed to form a magnified virtual image having a negative spherical aberration for electrons leaving a given object plane position with a given angular aperture, the mesh consisting of an ellipsoid of revolution that is recessed relative to the object plane and symmetrical with respect to the optical axis; and a lens system including electrodes arranged coaxially with the optical axis on the image plane side and forming a real image of the magnified virtual image. The electrodes consist of coaxial planes which together generate a focusing electric field that creates a positive spherical aberration. In the techniques of Japanese Patent No. 4,802,340, the acceptance solid angle for electrons is increased to the order of ±60 degrees by the use of an aspherical mesh which is an ellipsoid of revolution whose major axis lies in the direction of the optical axis. For the mesh, the ratio of the radius of the major axis to the radius of the minor axis in the ellipsoid of revolution is set to 1.5 to 2.

In an electron spectrometer, as the acceptance solid angle of the input lens for electrons is increased, the sensitivity is increased. Therefore, there is a need for an input lens having a greater acceptance solid angle for electrons.

SUMMARY OF THE INVENTION (1) One embodiment of the input lens associated with the present invention is for use in an electron spectrometer and disposed between an electron source producing electrons and an electron analyzer in the electron spectrometer. The input lens comprises: a reference electrode at a reference potential; a slit; first through nth electrodes (where n is an integer equal to or greater than three) arranged between the reference electrode and the slit; and a mesh attached to the first electrode. The first through nth electrodes are arranged in this order along an optical axis. The mesh is at a potential higher than the reference potential.

In this input lens, the mesh is at a higher potential than the reference potential and, therefore, a convex lens can be formed in an accelerating field between the reference electrode and the mesh. Consequently, for the input lens, the acceptance solid angle for electrons can be set to higher values.

(2) One embodiment of the electron spectrometer associated with the present invention has the input lens defined as just above and an electron analyzer. The input lens is located between the electron source and the electron analyzer.

This electron spectrometer includes the input lens having a large acceptance solid angle for electrons and so electrons can be detected with improved sensitivity.

DESCRIPTION OF THE INVENTION

The preferred embodiments of the present invention are hereinafter described in detail with reference to the accompanying drawings. Note that embodiments given below are not intended to unduly restrict the contents of the present invention set forth in the claims and that all the configurations described below are not always constituent components of the present invention.

1. First Embodiment 1-1. Configuration of Input Lens

Figure 1:
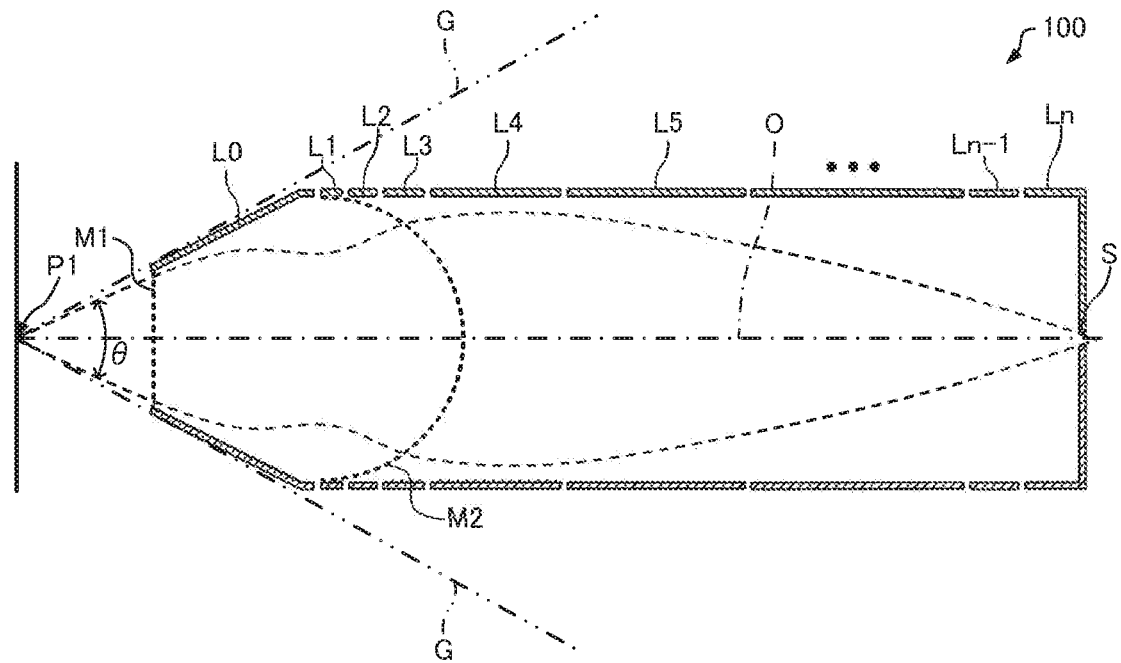
FIG. 1 is a schematic cross-sectional view of an input lens associated with a first embodiment of the present invention.

An input lens associated with a first embodiment is first described by referring to FIG. 1, which is a schematic cross-sectional view of the input lens, 100, associated with the first embodiment. In FIG. 1, electron trajectories are indicated by broken lines.

The input lens 100 is for use in an electron spectrometer having an electron source P1 and an electron analyzer, and is disposed between the electron source P1 and the electron analyzer in the spectrometer. As shown in FIG. 1, the input lens 100 includes a reference electrode L0, a first electrode L1, a second electrode L2, a third electrode L3, a fourth electrode L4, a fifth electrode L5, . . . , an (n−1)th electrode Ln−1, an nth electrode Ln, a first mesh M1, a second mesh M2, and a slit S. The first mesh M1 is one example of another mesh referred to herein. The second mesh M2 is one example of a mesh referred to herein.

The reference electrode L0 is positioned on the side of the electron source P1. In the input lens 100, the reference electrode L0 forms an entrance for electrons and is shaped cylindrically. In the illustrated example, the reference electrode L0 is in the form of a truncated cone. The potential of the reference electrode L0 is a reference potential. In the input lens 100, the reference potential is ground potential. The first mesh M1 is attached to the reference electrode L0.

The optical axis O of the input lens 100 is the central axis of the reference electrode L0, for example.

The first through nth electrodes L1 to Ln are disposed between the reference electrode L0 and the slit S and arranged in this order along the optical axis O. The first through nth electrodes L1 to Ln are in a tubular form, for example. In the illustrated example, they are cylindrical in shape. The optical axis O is a central axis, for example, of the first through nth electrodes L1 to Ln. The optical axis O is the central axis common to the reference electrode L0 and to the first through nth electrodes L1 to Ln. It suffices that the input lens 100 has three electrodes. That is, n is an integer equal to or greater than three.

In the illustrated example, the first through nth electrodes L1 to Ln are located inside a circular cone whose generatrix is a straight line G connecting the electron source P1 and the entrance-side end of the reference electrode L0. Alternatively, the first through nth electrodes L1 to Ln may be located outside the circular cone in a manner not illustrated.

The first electrode L1 is at a positive potential higher than that of the reference electrode L0. A positive voltage is applied to the first electrode L1. The potentials of the second to nth electrodes L2 to Ln can be set according to electron spectroscopy conditions. A positive or negative voltage is applied to each of the second to nth electrodes L2 to Ln.

The voltages applied to the first through nth electrodes L1 to Ln are variable, for example. The input lens 100 has a voltage source (not shown) for applying the voltages to the first through nth electrodes L1 to Ln.

The first mesh M1 is located at the entrance of the input lens 100 for electrons and attached to the reference electrode L0. The first mesh M1 is at the same potential as the reference electrode L0. That is, the potential of the first mesh M1 is ground potential. The first mesh M1 is a planar mesh and constitutes an electrostatic shield. The first mesh M1 serves to reduce leakage of electric fields from the front end of the input lens 100.

The second mesh M2 is attached to the first electrode L1 and at the same potential as the first electrode L1. That is, the second mesh M2 is at a higher potential than the reference electrode L0.

The second mesh M2 is shaped concavely relative to the electron source P1. The shape of the second mesh M2 is defined, for example, by a solid of revolution about the optical axis O. One example of the solid of revolution is an ellipsoid of revolution about the optical axis O. For example, the second mesh M2 may be an aspherical mesh obtained by finely adjusting the shape of an ellipsoid of revolution so as to minimize the spherical aberration. For example, the ratio a/b of the major axis a to the minor axis b of the ellipsoid of revolution of the second mesh M2 may be so set as to lie in the range of 1.5 to 2.0. Consequently, the acceptance solid angle θ for electrons can be increased, for example, as compared with the case where the second mesh M2 is spherical in shape (see the above-cited Japanese Patent No. 4,802,340).

The slit S is at the output of the input lens 100. That is, the slit S forms an exit of the input lens 100 for electrons. Electrons exit from the input lens 100 through the slit S.

In the foregoing, as shown in FIG. 1, the second mesh M2 is attached to the first electrode L1. Additionally, another mesh similar to the second mesh M2 may be attached to at least one of the second to nth electrodes L2-Ln.

1.2. Operation of Input Lens

Electrons emanating from the electron source P1 enter the input lens 100. There is no potential gradient from the electron source P1 to the first mesh M1. Therefore, the electron trajectory between the electron source P1 and the first mesh M1 is linear. Electrons generated from the electron source P1 pass through the first mesh M1 and enter the input lens 100.

The positive voltage is applied to the second mesh M2 to thereby create an electric field between the first mesh M1 and the second mesh M2, i.e., between the reference electrode L0 and the second mesh M2. This electric field creates a convex lens in an accelerating field. Consequently, between the first mesh M1 and the second mesh M2, electrons are attracted toward the optical axis O. Hence, the acceptance solid angle θ for electrons can be increased, for example, as compared with the case where the potential of the second mesh M2 is the reference potential. The electric fields set up by the second to nth electrodes L2 to Ln produce an electrostatic lens system between the second mesh M2 and the slit S.

In the input lens 100, the potential of the reference electrode L0 is the reference potential. The potential of the second mesh M2 is set higher than the reference potential. This introduces a positive spherical aberration in the electric field produced between the reference electrode L0 and the second mesh M2. Therefore, the voltages applied to the second to nth electrodes L2 to Ln are so set that the positive spherical aberration is canceled out, i.e., a negative spherical aberration is produced by the electric fields that are generated by the second to nth electrodes L2 to Ln.

Consequently, in the input lens 100, the positive spherical aberration produced by the electric field generated between the reference electrode L0 and the second mesh M2 can be canceled out by the negative spherical aberration produced by the electric fields set up by the second to nth electrodes L2 to Ln. As a result, the electrons generated from the electron source P1 are focused onto the slit S.

If a positive voltage is applied to the second mesh M2, i.e., if the potential of the second mesh M2 is set higher than the reference potential, the energies of electrons assumed upon passing through the second mesh M2 are increased by an amount corresponding to the potential of the second mesh M2. Therefore, even if a deceleration lens is adopted using the second to nth electrodes L2 to Ln, chromatic aberrations can be suppressed.

1.3. Advantageous Effects

The input lens 100 yields the following advantageous effects. The input lens 100 includes the reference electrode L0 at the reference potential, the slit S, the first through nth electrodes L1 to Ln disposed between the reference electrode L0 and the slit S, and the second mesh M2 attached to the first electrode L1. The first through nth electrodes L1 to Ln are arranged in this order along the optical axis O. The second mesh M2 is at a higher potential than the reference potential. In this way, in the input lens 100, the second mesh M2 is at a higher potential than the reference potential and so the electric field generated between the reference electrode L0 and the second mesh M2 creates a convex lens in an accelerating field. In consequence, electrons are attracted toward the optical axis O between the reference electrode L0 (first mesh M1) and the second mesh M2. Thus, in the input lens 100, the acceptance solid angle θ for electrons can be set to a higher value.

In the input lens 100, as noted above, electrons are attracted toward the optical axis O by the action of the convex lens of the accelerating field between the first mesh M1 and the second mesh M2. Therefore, electrons passing near the reference electrode L0 can be accepted. As a consequence, the solid angle of the space occupied by the input lens 100 (i.e., the vertical angle of the cone whose generatrix is the straight line G) and the acceptance solid angle θ for electrons can be made substantially equal to each other. This allows for miniaturization of the input lens 100.

In the input lens 100, the electric field produced between the reference electrode L0 and the second mesh M2 generates a positive spherical aberration, while the electric fields produced by the second to nth electrodes L2 to Ln generate a negative spherical aberration. Therefore, in the input lens 100, spherical aberrations can be suppressed. Consequently, in the input lens 100, if the acceptance solid angle θ for electrons is increased, electrons can be focused with the slit S.

In the input lens 100, the second mesh M2 is at a higher potential than the reference potential and so chromatic aberrations can be suppressed as mentioned previously. Therefore, in the input lens 100, if electrons having a wide energy range enter the input lens 100, they can be brought to a focus by means of the slit S.

In order to operate the electron analyzer with a higher energy resolution, it is customary to use the input lens as a decelerator. Under this condition, the input lens spectroscopically disperses electrons only a little. The electron analyzer behind the input lens implements spectroscopic dispersion. However, where an input lens is used as an accelerator, the input lens matches or excels an electron analyzer in spectroscopic capability. Accordingly, chromatic aberrations in an input lens can limit the range of energies that can be accepted at the same time.

The input lens 100 includes the first mesh M1 attached to the reference electrode L0 and thus leakage of electric fields from the front end of the input lens 100 can be reduced.

2. Second Embodiment 2.1. Configuration of Input Lens

Figure 2:
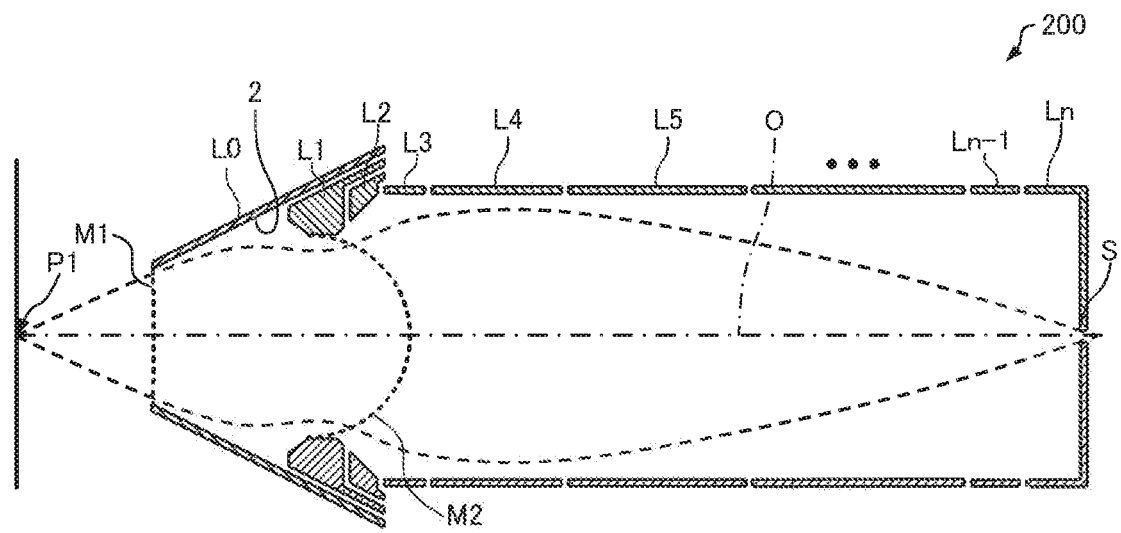
FIG. 2 is a schematic cross-sectional view of an input lens associated with a second embodiment.

An input lens associated with a second embodiment is next described by referring to FIG. 2, which is a schematic cross-sectional view of the input lens, 200, associated with the second embodiment. Those members of the input lens 200 which are similar in function to their counterparts of the input lens 100 associated with the first embodiment are indicated by the same reference numerals as in the foregoing figures and a detailed description thereof is omitted.

As shown in FIG. 2, in the input lens 200, the first electrode L1 protrudes from the inner surface 2 of the reference electrode L0 toward the optical axis O. A positive voltage is applied to the first electrode L1. Electrons are attracted toward the optical axis O. Therefore, although the first electrode L1 protrudes toward the optical axis O, the first electrode L1 does not block the electron path. Consequently, in the input lens 200, the second mesh M2 can be attached while preventing enlargement of the front end of the input lens.

The protrusion of the first electrode L1 permits the shape of the second mesh M2 to be varied. This, in turn, can vary the electric field produced by the second mesh M2 and hence the lens action can be varied. Furthermore, the protrusion of the first electrode L1 allows the lens action to be varied. In this way, in the input lens 200, the lens action can be varied by the shape of the first electrode L1 and/or the shape of the second mesh M2, so that the electron trajectory can be controlled.

The shapes of the second to nth electrodes L2 to Ln are varied according to the varied shapes of the first electrode L1 and of the second mesh M2. In the illustrated example, the second electrode L2 protrudes from the inner surface 2 of the reference electrode L0 toward the optical axis O in the same way as the first electrode L1. The distance between the first electrode L1 and the optical axis O is less than the distance between the second electrode L2 and the optical axis O.

The protrusion of the first electrode L1 permits the potentials in the vicinity of the second mesh M2 to be controlled finely. Furthermore, the protrusion of the second electrode L2 permits the potentials in the vicinity of the second mesh M2 to be controlled more finely.

2.2. Operation of Input Lens

The operation of the input lens 200 is similar to the above-described operation of the input lens 100 except that different voltages are applied to the first through nth electrodes L1 to Ln because the shapes of the second mesh M2, first electrode L1, and second electrode L2 of the input lens 200 are different.

2.3. Advantageous Effects

The input lens 200 yields the following advantageous effects. The input lens 200 yields the same advantageous effects as the above-described input lens 100. In addition, in the input lens 200, because the first electrode L1 protrudes from the inner surface 2 of the reference electrode L0 toward the optical axis O, the first electrode L1 can be placed without the need to increase the size of the front end portion of the input lens 200. Consequently, the input lens 200 can be miniaturized.

3. Third Embodiment 3.1. Configuration of Input Lens

Figure 3:
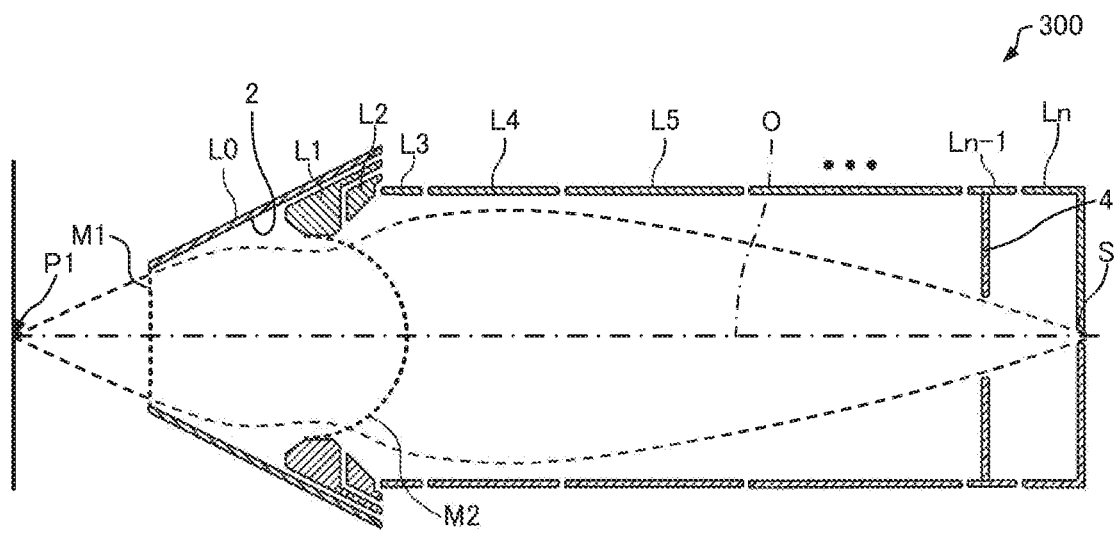
FIGS. 3-6 are schematic cross-sectional views of an input lens associated with a third embodiment, illustrating different states of operation.

An input lens associated with a third embodiment is next described by referring to FIG. 3, which is a schematic cross-sectional view of the input lens, 300, associated with the third embodiment. Those members of the input lens 300 which are functionally similar to their counterparts of the input lens 100 associated with the first embodiment and the input lens 200 associated with the second embodiment are indicated by the same reference numerals as in the foregoing figures and a detailed description thereof is omitted.

In the input lens 300, the distance between the (n−1)th electrode Ln−1 and the optical axis O is less than both the distance between the (n−2)th electrode Ln−2 and the optical axis O and the distance between the nth electrode Ln and the optical axis O. In the illustrated example, the (n−1)th electrode Ln−1 has a protrusive portion 4 protruding toward the optical axis O. Consequently, if the potential difference between the (n−1)th electrode Ln−1 and the (n−2)th electrode Ln−2 is small and, at the same time, the potential difference between the (n−1)th electrode Ln−1 and the nth electrode Ln is small, a strong lens action can be produced near the (n−1)th electrode Ln−1.

As an example, in the input lens 200 shown in FIG. 2, in order to produce a strong lens action in the vicinity of the (n−1)th electrode Ln−1, a high voltage must be applied to it. If so, a large potential difference is created between any two adjacent electrodes, thus producing electric discharges. In the input lens 300, the potential differences between the adjacent electrodes can be reduced by providing the (n−1)th electrode Ln−1 with the protrusive portion 4. Hence, the possibility of such electric discharges and other problems can be reduced.

3.2. Operation 3.2.1. Focusing within Input Lens

Figure 4:
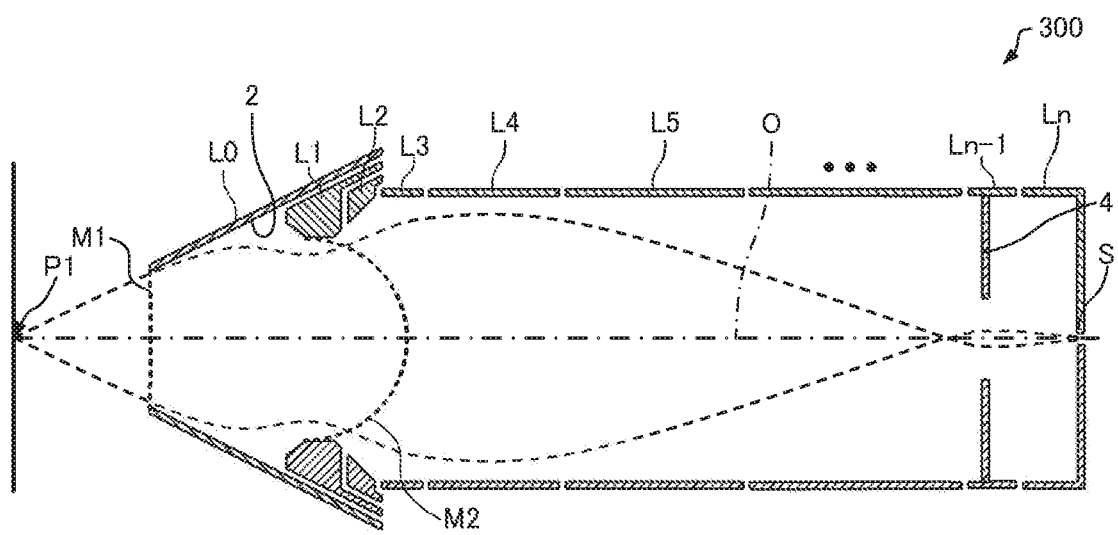

FIG. 4 illustrates the operation of the input lens 300 and corresponds to FIG. 3. The input lens 300 has two states of operation. In one of the two states, as shown in FIG. 3, electrons are not focused within the input lens 300. In the other state, as shown in FIG. 4, electrons are focused within the input lens 300.

In the state of operation shown in FIG. 3, the (n−2)th electrode Ln−2, the (n−1)th electrode Ln−1, and the nth electrode Ln are substantially equipotential. These electrodes Ln−2 to Ln together produce a weak lens action. Therefore, in the state of operation of FIG. 3, the electron trajectory is almost identical to that shown in the state of operation of FIG. 2, and electrons are focused at the slit S.

By varying the voltages applied to the first-nth electrodes L1-Ln from the state of the input lens shown in FIG. 3, electrons can be focused at two points, i.e., in the vicinity of the (n−1)th electrode Ln−1 and at the slit S, as shown in FIG. 4.

In the input lens 300, the state of operation can be switched between the state of operation in which electrons are not focused within the input lens as shown in FIG. 3 and the state of operation in which electrons are focused within the input lens as shown in FIG. 4, by controlling the voltages applied to the first through nth electrodes L1 to Ln. As described above, in the input lens 300, the distance between the (n−1)th electrode Ln−1 and the optical axis O is small and, therefore, a strong lens action can be produced in the vicinity of the (n−1)th electrode Ln−1. Consequently, electrons can be brought to a focus in the vicinity of the (n−1)th electrode Ln−1.

In the state of operation of FIG. 4 where electrons are focused within the input lens 300, the image magnification factor of the input lens 300 and the set range of angular magnifications can be increased by varying the focal position. In order to vary the energy resolution in electron spectroscopy, it is necessary to vary the deceleration ratio of the input lens. Good electron spectroscopy can be performed over a wider range of deceleration ratios by varying the image magnification or angular magnification according to the deceleration ratio. If electrons are focused within the input lens, there occurs the advantage that the image magnification and angular magnification can be set within wider ranges, but greater chromatic aberrations are produced. Accordingly, the state of operation is switched between the state of operation in which electrons are not focused within the input lens as shown in FIG. 3 and the state of operation in which electrons are focused within the input lens as shown in FIG. 4 according to electron spectroscopy conditions.

In the above example, the (n−1)th electrode Ln−1 is provided with the protrusive portion 4, and the distance between the (n−1)th electrode Ln−1 and the optical axis O is less than both the distance between the (n−2)th electrode Ln−2 and the optical axis O and the distance between the nth electrode Ln and the optical axis O. The electrode provided with the protrusive portion 4 may be any one of the second to (n−1)th electrodes L2 to Ln−1. That is, the mth electrode Lm (m=2, 3, . . . , n−1) is provided with the protrusive portion 4. The distance between the mth electrode Lm and the optical axis O may be less than both the distance between the (m−1)th electrode Lm−1 and the optical axis O and the distance between the (m+1)th electrode Lm+1 and the optical axis O. As a result, a strong lens action can be produced in the vicinity of the mth electrode Lm.

Figure 5:
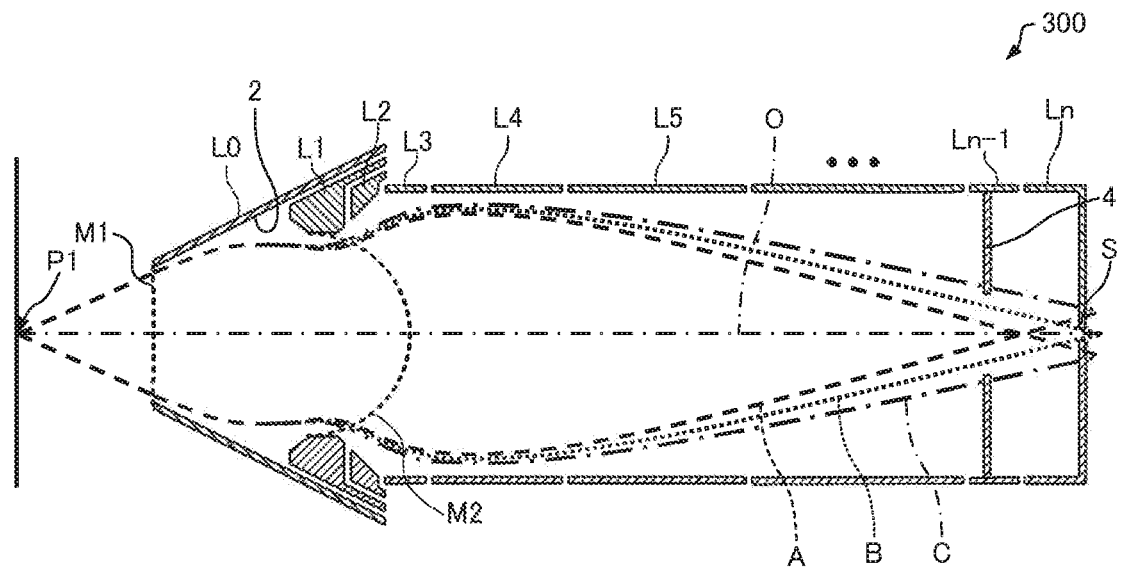
Figure 6:
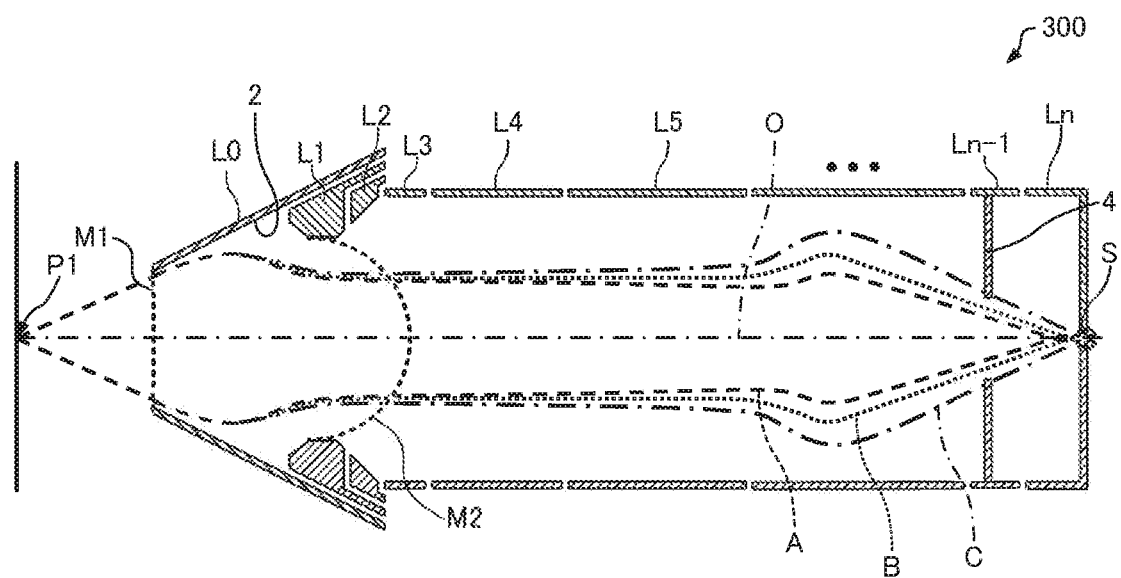

3.2.2. Correction of Spherical Aberration and Correction of Chromatic Aberration FIGS. 5 and 6 illustrate the operation of the input lens 300. The input lens 300 can accomplish a spherical aberration correcting lens shown in FIG. 5 and an acceleration electrostatic lens shown in FIG. 6.

When the input lens 300 shown in FIG. 5 is used as a spherical aberration correcting lens, the input lens 300 is operated similarly to the state of operation illustrated in FIG. 3. That is, a positive voltage is applied to the second mesh M2 to thereby produce a convex lens in an accelerating field. The positive spherical aberration produced by the electric field set up between the reference electrode L0 and the second mesh M2 is reduced by the negative spherical aberration generated by the electric fields set up by the second to nth electrodes L2 to Ln.

FIG. 5 shows electron trajectories drawn under the conditions: electrons have energy Ek at the electron source P1 and energy Ep at the slit S and are accelerated by a factor of five in the input lens 300. Regarding the trajectory A, Ep/Ek=5.00×0.95. Regarding the trajectory B, Ep/Ek=5.00×1.00. Regarding the trajectory C, Ep/Ek=5.00×1.05.

When the input lens 300 is operated as a spherical aberration correcting lens, spherical aberration can be reduced as shown in FIG. 5.

When the input lens 300 shown in FIG. 6 is operated as an acceleration electrostatic lens, the potential difference between the first electrode L1 and the second electrode L2 of the input lens 300 is smaller than that in the input lens in the state of operation shown in FIG. 5.

Reducing the potential difference between the first electrode L1 and the second electrode L2 lessens the effect of correction of spherical aberration. As a result, the spherical aberration of the whole input lens is positive.

Where the potential difference between the first electrode L1 and the second electrode L2 is set to zero and the potential difference from the second electrode L2 to the nth electrode Ln is also set to zero, the electron trajectory following the second mesh M2 is linear. Therefore, the spherical aberration of the whole input lens is positive. This condition is close to a condition where the second mesh M2 is not present and approximates the operation of a general acceleration electrostatic lens.

FIG. 6 shows electron trajectories drawn under the conditions: electrons have energy Ek at the electron source P1 and energy Ep at the slit S and are accelerated by a factor of five in the input lens 300. Regarding the trajectory A, Ep/Ek=5.00×0.95. Regarding the trajectory B, Ep/Ek=5.00×1.00. Regarding the trajectory C, Ep/Ek=5.00×1.05.

Where the potential difference between the first electrode L1 and the second electrode L2 is reduced and the input lens 300 is operated as an acceleration electrostatic lens, chromatic aberration can be reduced as shown in FIG. 6.

In the foregoing example, electrons are accelerated by a factor of five in the input lens 300. Note that the factor is merely exemplary and is not limited to five.

In the input lens 300, as described previously, the state of operation can be switched between the state of operation of FIG. 5 where the input lens 300 is operated as a spherical aberration correcting lens and the state of operation of FIG. 6 where the input lens 300 is operated as an acceleration electrostatic lens by controlling the voltages applied to the first through nth electrodes L1 to Ln.

In an electron spectrometer, the spherical aberration in the input lens is directly associated with the sensitivity of the electron analyzer, and the chromatic aberration in the input lens is directly associated with the range of energies of electrons that can be accepted at the same time. Consequently, the electron spectrometer including the input lens 300 can perform electron spectroscopy under optimum conditions by controlling the voltages applied to the first through nth electrodes L1 to Ln according to electron spectroscopy conditions of the electron analyzer and other conditions.

4. Fourth Embodiment

4.1. Configuration of Input Lens

Figure 7:
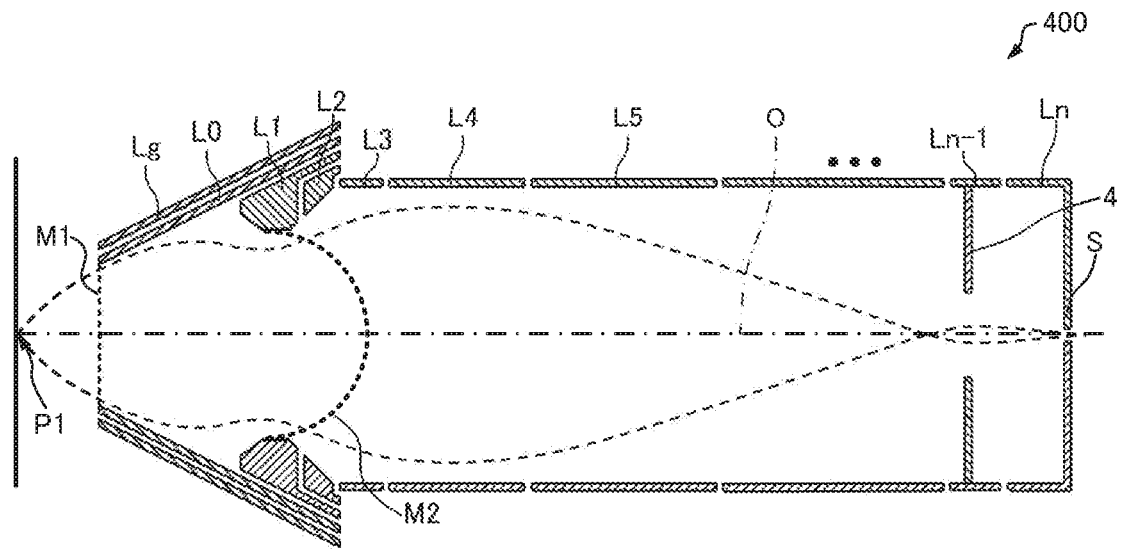
FIG. 7 is a schematic cross-sectional view of an input lens associated with a fourth embodiment.

An input lens associated with a fourth embodiment is next described by referring to FIG. 7, which is a schematic cross-sectional view of the input lens, 400, associated with the fourth embodiment. Those members of the input lens 400 which are similar in function to their respective counterparts of the input lens 100, input lens 200, and input lens 300 associated with the first, second, and third embodiments, respectively, are indicated by the same reference numerals as in the foregoing figures and a detailed description thereof is omitted.

As shown in FIG. 7, the input lens 400 includes a ground electrode Lg that is disposed outside the reference electrode L0. The ground electrode Lg is cylindrical, and the reference electrode L0 is disposed inside the ground electrode Lg. In the illustrated example, the reference electrode L0, the first electrode L1, and the second electrode L2 are arranged inside the ground electrode Lg that is at ground potential. The input lens 400 has a voltage source (not shown) for applying a voltage to the reference electrode L0.

4.2 Operation of Input Lens

In the input lens 400, the reference potential is a positive potential. That is, positive voltages are applied to the reference electrode L0 and the first mesh M1. As a result, electrons can be efficiently guided from the electron source P1 to the first mesh M1. If voltage variations in the reference electrode L0 are made proportional to the energy being measured by the electron analyzer, the solid angle of acceptance subtended from the electron source P1 to the first mesh M1 is constant over the whole energy range.

Where X-rays are directed at a sample such as in an X-ray photoelectron spectrometer, even if a large electric field leaks from the input lens, the X-rays impinging on the sample are not affected. On the other hand, where an electron beam is directed at a sample such as in an Auger electron spectrometer, the electron beam is deflected by the effects of the electric fields leaking from the input lens.

In an Auger electron spectrometer, for example, if an objective lens is used as an electron source, magnetic fields leaking out of the objective lens may reach close to the sample. Especially, in a high spatial resolution apparatus, the working distance between the bottom surface of the objective lens and the sample is short and the magnetic fields in the vicinities of the sample are higher. Under this condition, electrons emanating from the sample, especially lower energy electrons, do not reach the first mesh M1 from the electron source P1 by the effects of the magnetic fields, thus lowering the sensitivity of the electron analyzer.

In the input lens 400, if a voltage of a positive fixed value is applied to the reference electrode L0, only lower energy electrons can be pulled into the first mesh M1. Therefore, deterioration of the sensitivity of the electron analyzer due to the objective lens magnetic field can be reduced. Furthermore, by increasing the voltage applied to the first mesh M1, the sensitivity to low energy electrons can be improved selectively.

In an Auger electron spectrometer, for example, the linewidth of the electron beam is decreased in order to image or analyze microscopic regions. In this case, it is necessary to replace the out-lens of the objective lens with a semi-in lens or further with an in-lens. At this time, if the prior-art input lens is used, secondary electrons released from the sample, backscattered electrons, and Auger electrons cannot enter the input lens due to magnetic fields leaking out of the objective lens. This may reduce the sensitivity of the electron analyzer. Especially, the sensitivity to lower energy electrons decreases.

On the other hand, in the input lens 400, as described above, lower energy electrons can be pulled into the first mesh M1 by applying a positive voltage to the reference electrode L0. Therefore, in an Auger electron spectrometer, if the objective lens is a semi-in lens or an in-lens, the sensitivity of the electron analyzer can be prevented from deteriorating.

5. Fifth Embodiment

Figure 8:
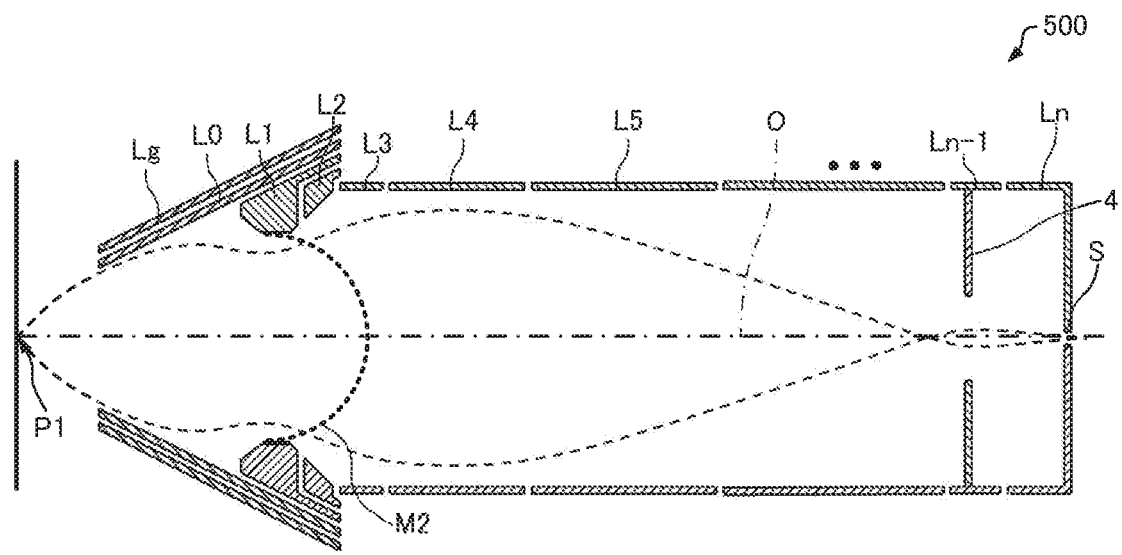
FIG. 8 is a schematic cross-sectional view of an input lens associated with a fifth embodiment.

An input lens associated with a fifth embodiment is next described by referring to FIG. 8, which is a schematic cross-sectional view of the input lens, 500, associated with the fifth embodiment. Those members of the input lens 500 which are similar in function to their counterparts of the input lens 100, input lens 200, input lens 300, and input lens 400, respectively, associated with the first, second, third, and fourth embodiments, are indicated by the same reference numerals as in the foregoing figures and a detailed description thereof is omitted.

As shown in FIG. 8, the input lens 500 does not have the first mesh M1. By detaching the first mesh M1, the sensitivity of the electron detector or analyzer can be enhanced as compared with the case where the first mesh M1 is attached. In particular, since the electron transmissivity of the first mesh M1 is not 100%, the sensitivity of the electron detector can be improved by an amount equal to "1−transmissivity".

When the first mesh M1 is taken out, the electric fields leaking out of the front end of the input lens 500 vary. The leaking electric fields can be adjusted, for example, with the voltage applied to the reference electrode L0.

6. Sixth Embodiment

Figure 9:
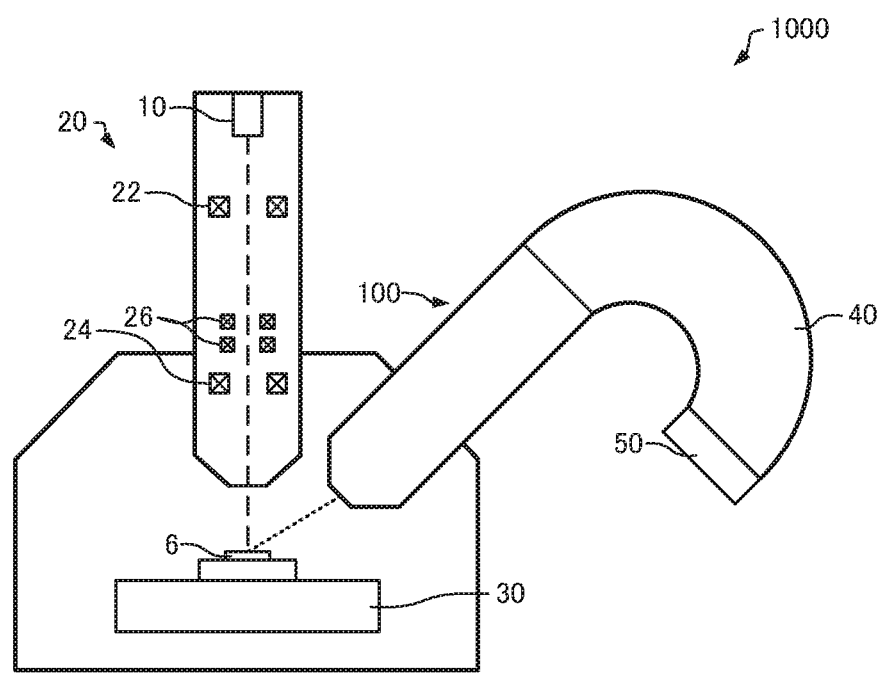
FIG. 9 is a diagram illustrating the configuration of an electron spectrometer associated with a sixth embodiment.

An electron spectrometer associated with a sixth embodiment is next described by referring to FIG. 9, which shows the configuration of the electron spectrometer, 1000, associated with the sixth embodiment.

The electron spectrometer 1000 is an apparatus for analyzing a sample 6 by Auger electron spectroscopy. Auger electron spectroscopy is technology for performing elemental analysis by measuring the energies of Auger electrons emitted from a sample (e.g., sample 6) that are excited by an electron beam or the like and released from the sample.

As shown in FIG. 9, the electron spectrometer 1000 includes an electron source 10, an optical system 20, a sample stage 30, an input lens 100, an electron analyzer 40, and a detector 50.

The electron source 10 produces an electron beam. For example, the electron source 10 is an electron gun which emits an electron beam by accelerating electrons, released from a cathode, by means of an anode. The optical system 20 causes the electron beam emitted from the electron source 10 to be directed at the sample 6. The optical system 20 includes condenser lenses 22, an objective lens 24, and deflectors 26.

The electron beam emitted from the electron source 10 can be focused into a probe of electrons by the condenser lenses 22 and the objective lens 24. The deflectors 26 deflect the electron beam focused by the condenser lenses 22 and the objective lens 24. The deflectors 26 are used, for example, to scan the electron beam over the sample 6.

The sample stage 30 holds the sample 6 thereon. The sample stage 30 is equipped with a horizontal drive mechanism for moving the sample 6 horizontally, a vertical drive mechanism for moving the sample 6 in a heightwise direction, and a tilt mechanism for tilting the sample 6. The sample stage 30 permits the sample 6 to be placed in position.

The electron analyzer 40 spectrally disperses Auger electrons produced from the sample 6 in response to irradiation of the sample 6 by the electron beam. The electron analyzer 40 is an electrostatic hemispherical analyzer, for example.

The input lens 100 is positioned between the electron source and the electron analyzer 40, the electron source producing Auger electrons as the sample 6 is irradiated with the electron beam. The input lens 400 accepts incoming electrons and guides them into the electron analyzer 40. For example, the input lens 100 provides variable energy resolution by decelerating the electrons. In the input lens 100, as electrons are decelerated to a greater extent, the resolution is improved but at the cost of the sensitivity.

The electron analyzer 40 has an inner hemispherical electrode and an outer hemispherical electrode. In the electron analyzer 40, by applying a voltage between the inner and outer hemispherical electrodes, electrons having energies lying in an energy range corresponding to the applied voltage can be extracted. The detector 50 detects the electrons spectrally dispersed by the electron analyzer 40.

The electron spectrometer 1000 includes the input lens 100 having a large acceptance solid angle θ for electrons and, therefore, Auger electrons released from the sample can be detected at high sensitivity.

In the foregoing description, the electron spectrometer 1000 includes the input lens 100. Alternatively, the electron spectrometer 1000 may include one of the above-described input lenses 200, 300, and 400.

Furthermore, in the foregoing description, the electron spectrometer 1000 is an Auger electron spectrometer. The electron spectrometer 1000 may also be an X-ray photoelectron spectrometer or other type of electron spectrometer.

It is to be understood that the present invention is not restricted to the foregoing embodiments and that the invention can be practiced in variously varied forms. For example, the invention embraces configurations which are substantially identical to the configurations described in the embodiments. What are meant by the substantially identical configurations are configurations which are identical in functions, method, and results or in purpose and effects, for example. Furthermore, the present invention embraces configurations which are similar to the configurations described in the above embodiments except that nonessential portions have been replaced. In addition, the present invention embraces configurations which are identical in functional effects or purpose to the configurations described in the above embodiments. Further, the present invention embraces configurations similar to the configurations of the above embodiments except that well-known techniques have been added.

What is claimed is:

1. An input lens for use in an electron spectrometer and disposed between an electron source producing electrons and an electron analyzer in the electron spectrometer, said input lens comprising:
    a reference electrode at a reference potential;
    a slit;
    first through nth electrodes, where n is an integer equal to or greater than three, arranged between the reference electrode and the slit; and
    a mesh attached to the first electrode;
    wherein said first through nth electrodes are arranged in this order along an optical axis;
    wherein said mesh is at a potential higher than said reference potential;
    wherein a distance between an mth electrode, where m=2, 3, . . . , n−1, and the optical axis is less than both a distance between an (m−1)th electrode and the optical axis O and a distance between an (m+1)th electrode and the optical axis O; and
    wherein an electric field is produced between said reference electrode and said mesh and induces a positive spherical aberration, and wherein the second through nth electrodes produce electric fields which together induce a negative spherical aberration.

2. An input lens as set forth in claim 1, wherein said reference electrode and said first through nth electrodes are cylindrical in shape, and wherein the first electrode protrudes from an inner surface of the reference electrode toward said optical axis.

3. An input lens as set forth in claim 1, wherein voltages applied to said first through nth electrodes are variable.

4. An input lens as set forth in claim 1, further comprising another mesh attached to said reference electrode.

5. An input lens as set forth in claim 1, wherein said reference potential is a positive potential.

6. An input lens as set forth in claim 5, further comprising a ground electrode which is disposed outside said reference electrode and at ground potential.

7. An input lens as set forth in claim 1, wherein said reference potential is ground potential.

8. An electron spectrometer comprising:
    an input lens as set forth in claim 1; and
    an electron analyzer;
    wherein the input lens is located between the electron source and the electron analyzer.

* * * * *